United States Patent
Lynch et al.

(10) Patent No.: US 8,462,133 B2
(45) Date of Patent: Jun. 11, 2013

(54) CLICKABLE AND TACTILE BUTTONS FOR A TOUCH SURFACE

(75) Inventors: Stephen Brian Lynch, Portola Valley, CA (US); John Benjamin Filson, San Jose, CA (US); Fletcher R. Rothkopf, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 665 days.

(21) Appl. No.: 12/240,559

(22) Filed: Sep. 29, 2008

(65) Prior Publication Data

US 2010/0079403 A1    Apr. 1, 2010

(51) Int. Cl.
*G06F 3/045*    (2006.01)
*G06F 3/041*    (2006.01)

(52) U.S. Cl.
USPC .......................................... 345/174; 345/173

(58) Field of Classification Search
None
See application file for complete search history.

(56) References Cited

U.S. PATENT DOCUMENTS

| | | | | |
|---|---|---|---|---|
| 5,726,400 A | * | 3/1998 | Masuda | 200/16 D |
| 6,323,449 B1 | * | 11/2001 | Janniere | 200/408 |
| 2002/0054030 A1 | * | 5/2002 | Murphy | 345/173 |
| 2003/0193480 A1 | * | 10/2003 | Nuovo et al. | 345/168 |
| 2003/0235452 A1 | * | 12/2003 | Kraus et al. | 400/472 |
| 2005/0088417 A1 | * | 4/2005 | Mulligan | 345/173 |
| 2007/0257821 A1 | * | 11/2007 | Son et al. | 341/22 |
| 2008/0029691 A1 | * | 2/2008 | Han | 250/224 |
| 2008/0150911 A1 | * | 6/2008 | Harrison | 345/173 |
| 2010/0026635 A1 | * | 2/2010 | Dimitrov et al. | 345/173 |
| 2010/0053087 A1 | * | 3/2010 | Dai et al. | 345/168 |

FOREIGN PATENT DOCUMENTS

JP    04075219 A    *    3/1992

* cited by examiner

*Primary Examiner* — Alexander S Beck
*Assistant Examiner* — Kirk Hermann
(74) *Attorney, Agent, or Firm* — Dorsey & Whitney LLP

(57) ABSTRACT

Methods and apparatus for provide physical buttons for use on a touch surface are disclosed. According to one aspect of the present invention, an apparatus includes a display arrangement and a first button attachment structure. The display arrangement includes a first surface which has a first touch-sensitive area. The first touch-sensitive area is capable of sensing touch. The first button attachment structure includes a first attachment area and a first button actuation area. The first attachment area is mounted on the first surface such that the first button actuation is aligned at least partially over the first touch-sensitive area. The first button actuation area is arranged to deform when a force is applied to the first button actuation area to engage the first touch-sensitive area.

21 Claims, 10 Drawing Sheets

900

CLICKABLE AND TACTILE BUTTONS FOR A TOUCH SURFACE

BACKGROUND OF THE INVENTION

1. Field of the Invention

The present invention relates to portable electronic devices and, more particularly, to a structure which enables touch-sensitive areas of a touchscreen to be activated.

2. Description of the Related Art

Many portable electronic devices include touchscreen displays, or displays which are capable of sensing the location of a touch or contact within a particular area. By way of example, when a person is using an electronic device that includes a touchscreen, he or she may touch a particular area of the touchscreen to cause the electronic device to perform a particular action.

Often, areas of a touchscreen such as buttons identified by the touchscreen may be accidentally activated. That is, a touch-sensitive area of a touchscreen may accidentally be touched. While a user is interacting with a touchscreen using a finger, he or she generally must cause his or her finger to hover above the touchscreen to avoid the accidental activation of a particular feature. Hovering a finger above a touchscreen effectively involves maintaining an air gap between the finger and the touchscreen. In addition, if a user is attempting to activate areas of the touchscreen in series, e.g., if a user is engaged in a series of button pushes, he or she generally must maintain an air gap between his or her finger and the touchscreen between button pushes to enable discrete button pushes to be substantially identified.

A user may also accidentally activate a button by pressing an area of a touchscreen that is between two defined touch areas. For instance, if a user intends to touch one touch area but instead causes another touch area to be touched, he or she may accidentally activate the wrong button.

Although a user may successfully avoid the accidental activation of a touchscreen by maintaining an air gap between his or her finger and the touchscreen, maintaining the air gap may be uncomfortable and inefficient. Hovering a finger over a touchscreen may cause a user's hand and finger to become fatigued. Additionally, if one hand is positioned such that a finger of that hand hovers over a touchscreen of a device, a user is less likely to be able to securely hold the device. The speed at which a user may press touch areas of a touch screen may be limited by the need to maintain an air gap between a finger and the touch areas.

Therefore, what is needed is a method and an apparatus which allows touch areas of a touchscreen to be comfortably and efficiently activated.

SUMMARY OF THE INVENTION

The present invention pertains to button attachment structures which may be attached to a touchscreen of a device to provide physical buttons for use to activate features of the device. The present invention may be implemented in numerous ways, including, but not limited to, as a method, system, device, or apparatus. Example embodiments of the present invention are discussed below.

According to one aspect of the present invention, an apparatus includes a display arrangement and a first button attachment structure. The display arrangement includes a first surface which has a first touch-sensitive area. The first touch-sensitive area is capable of sensing touch. The first button attachment structure includes a first attachment area and a first button actuation area. The first attachment area is mounted on the first surface such that the first button actuation is aligned at least partially over the first touch-sensitive area. The first button actuation area is arranged to deform when a force is applied to the first button actuation area to engage the first touch-sensitive area.

In accordance with another aspect of the present invention, a portable electronic device includes a touchscreen and a tactile structure. The touchscreen includes a first touch-sensitive area that is arranged to detect a presence of a touch. The first touch-sensitive area in non-tactile. The tactile structure is mounted on the touchscreen such that the tactile structure at least partially overlies the first touch-sensitive area. The tactile structure is configured to provide a physical interface that is used to engage the first touch-sensitive area.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

Figure 1A:
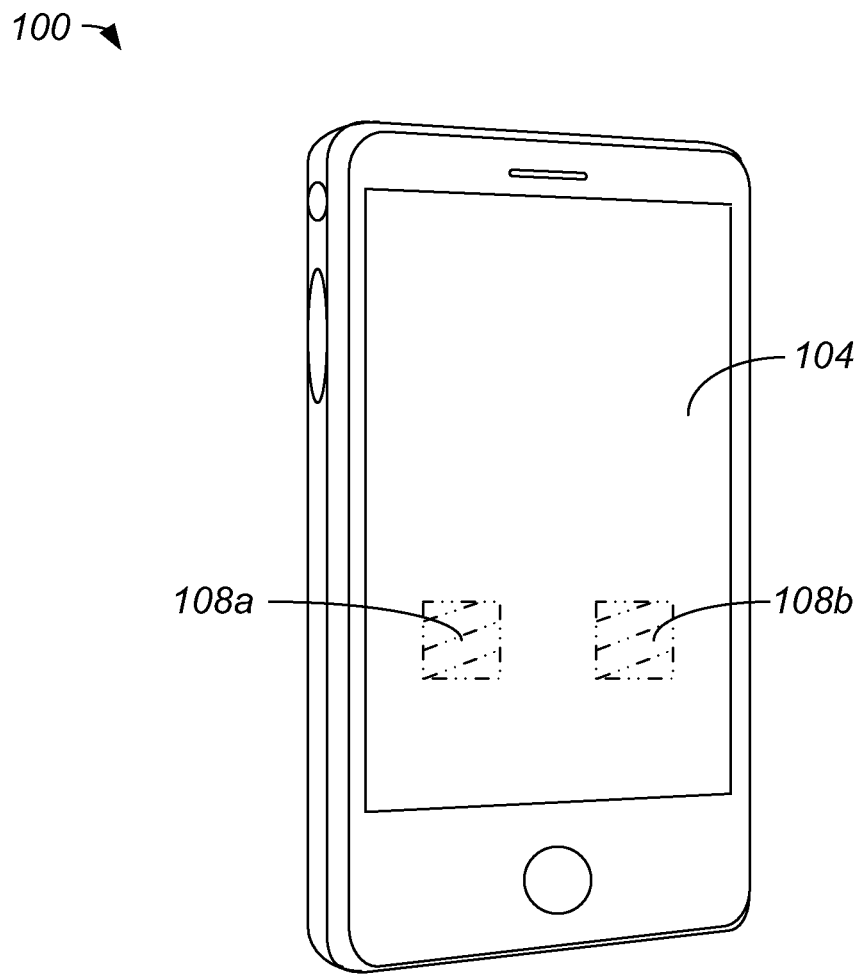
FIG. 1A is a diagrammatic representation of a portable electronic device with a touchscreen which includes touch-sensitive areas in accordance with an embodiment of the present invention.

Example embodiments of the present invention are discussed below with reference to the various figures. However, those skilled in the art will readily appreciate that the detailed description given herein with respect to these figures is for explanatory purposes, as the invention extends beyond these embodiments.

Coupling a physical, tactile structure to a touchscreen of an electronic device allows touch areas of the touchscreen, which otherwise essentially have no physical or tactile features, to be associated with a physical structure. That is, a physical, tactile structure may be mounted over a touch area of a touchscreen such that the structure effectively serves to provide a physical, tactile component to the touch area.

In one embodiment, a button attachment structure that is a physical, tactile structure may be provided on a touchscreen surface such that the button attachment structure may be used to activate touch areas of the touchscreen surface. Such a button attachment structure may be removably mounted on, e.g., substantially secured to, a touchscreen surface that is arranged to be activated by touch. The button attachment structure may be mounted on the touchscreen surface such that the button attachment overlies a touch area, or a touch-activatable area. Hence, when a user wishes to touch the touch area of the touchscreen surface, the user may press on, e.g., apply a force to, the button attachment structure to cause the button attachment structure to come into contact with the touch area. When a portion of the button attachment structure contacts the touch area, the touch area is engaged. Engaging the touch area may cause a function associated with the touch area to be substantially activated.

A button attachment structure may be configured such that a top surface, or a button actuation area, of the button attachment structure is positioned at a distance above a touchscreen. The distance enables an air gap to be maintained when the button actuation area is in an unactivated state. Hence, a touch area of the touchscreen, i.e., a touch sensitive area that is arranged to be activated by the button actuation area when a force is applied to the button actuation area, is effectively protected from being accidentally activated.

If a user does not apply a significant force to the button attachment structure mounted over a touch area on a touchscreen, the button actuation area of the structure may remain substantially unbuckled. As such, a user may rest his or her finger on the button attachment structure, e.g., between button pushes, substantially without accidentally causing a touch area of the touchscreen to be activated.

The use of button attachment structures mounted over touch areas on a touchscreen reduces the likelihood that a touch area may be accidentally touched, e.g., activated. The physical, tactile characteristics of the button attachment structures may effectively serve as physical and tactile guides which increase the ability for a user to accurately locate and touch, i.e., touch through the use of a button attachment structure, desired touch areas. That is, button attachment structures effectively provide a physical dimension to desired touch areas. In addition, button attachment structures provide tactile feedback which indicates that touch areas have been engages, or tactile feedback for button presses.

Referring initially to FIG. 1A, a portable electronic device that includes a touchscreen with touch areas will be described. A portable electronic device 100 includes a touchscreen 104 with touch areas 108a, 108b. In the described embodiment, portable electronic device 100 is a capacitive touch device. Portable electronic device 100 may be a device including, but not limited to including, a portable media player, a cellular telephone, a portable electronic gaming device, and/or a portable computing device, e.g., a personal digital assistant (PDA). In one embodiment, the portable electronic device may be an iPod™ or an iPhone™ available commercially from Apple Inc. of Cupertino, Calif.

Touch areas 108a, 108b are generally points of contact that enable a user to effectively interact with that which is displayed on touchscreen 104, e.g., icons and/or applications. When a user wishes to activate one of touch areas 108a, 108b, the user may touch the appropriate touch area 108a, 108b. Touching touch areas 108a, 108b effectively causes an input to be received by portable electronic device 100. Touch areas 108a, 108b are generally arranged to detect the presence of a touch, and may substantially cause an input to be received and processed by portable electronic device 100 when the presence of a touch is detected or otherwise identified.

Figure 1B:
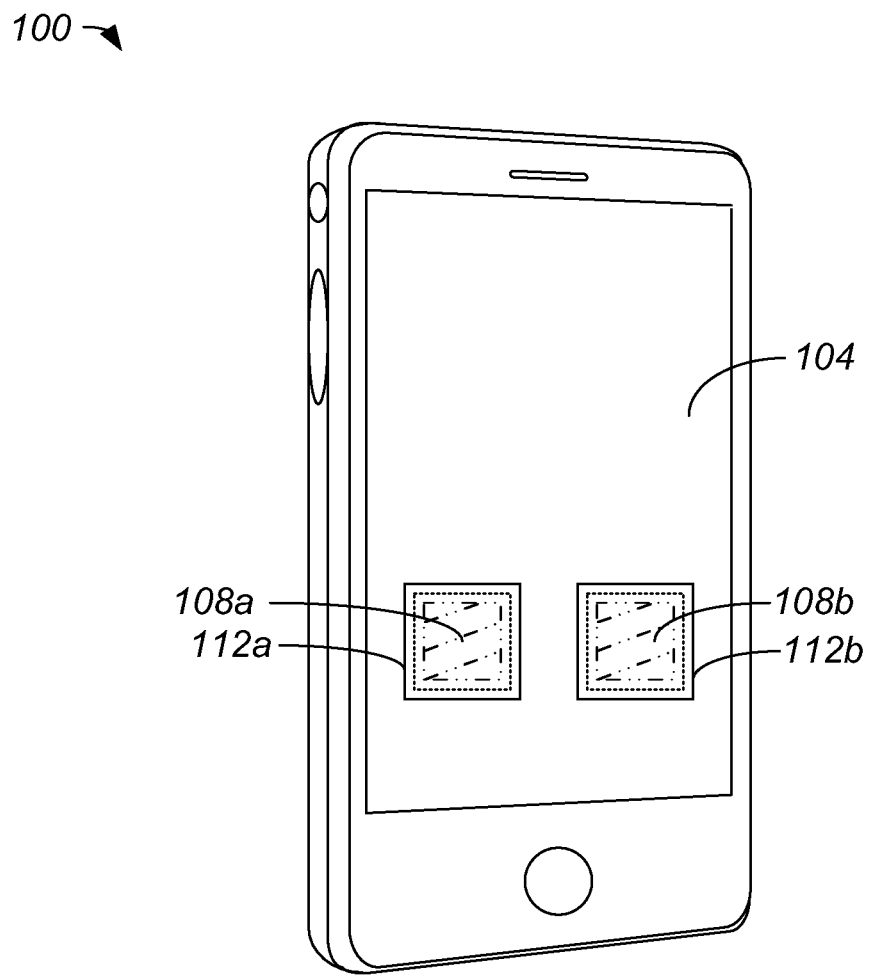
FIG. 1B is a diagrammatic representation of a portable electronic device, e.g., portable electronic device 100 of FIG. 1A, which includes button attachment structures positioned over touch sensitive areas in accordance with an embodiment of the present invention.

Touch areas 108a, 108b generally do not include a physical component or a tactile component. As such, a user generally visually identifies locations of touch areas 108a, 108b, and then touches, e.g., presses on, touch areas 108a, 108b as desired. In order to associate a physical, tactile component with touch areas 108a, 108b, button attachment structures may be positioned substantially over touch areas 108a, 108b. FIG. 1B is a diagrammatic representation of a portable electronic device 100 with button attachment structures positioned over touch areas in accordance with an embodiment of the present invention. A button attachment structure 112a is coupled to touchscreen 104 such that at least a portion of button attachment structure 112a is positioned over touch area 108a. Similarly, a button attachment structure 112b is coupled to touchscreen 104 such that at least a portion of button attachment structure 112b is positioned over touch area 108b.

Button attachment structures 112a, 112b effectively provide a physical, tactile component to touch areas 108a, 108b, respectively. Button attachment structures 112a, 112b are arranged such that when button attachment structures 112a, 112b are pressed, touch areas 108a, 108b, respectively, may be contacted. Upon contact, touch areas 108a, 108b are effectively engaged or activated.

The shape of each button attachment structure 112a, 112b may vary. Typically, button attachment structures 112a, 112b may have a dome-like shape, as will be discussed below. It should be understood that although button attachment structures 112a, 112b are shown as having a substantially rectangularly-shaped footprints, the shape of the footprints of button attachment structures 112a, 112b may vary.

In general, button attachment structures 112a, 112b are formed from a flexible material. The flexible material is typically stiff enough to allow button attachment structures 112a, 112b to maintain their shapes, and flexible enough to allow button attachment structures to be pressed to engage touch areas 108a, 108b, respectively. Suitable materials from which button attachment structures 112a, 112b may be formed may include materials such as silicone rubber or flexible plastics. To enable touch areas 108a, 108b to be viewed when button attachment structures 112a, 112b are positioned over touch areas 108a, 108b, button attachment structures 112a, 112b may be formed from a substantially transparent material. It should be appreciated, however, that button attachment structures 112a, 112b are not limited to being formed from a substantially transparent material. By way of example, button attachment structures 112a, 112b may be formed from a material which is colored or printed to effectively look like touch areas 108a, 108b.

Button attachment structures 112a, 112b may be formed such that suction forces allow button attachment structures 112a, 112b to be attached to touchscreen 104. Button attachment structures 112a, 112 may also be formed such that static allows button attachment structures 112a, 112b to be attached to touchscreen 104. Alternatively, button attachment structures 112a, 112b may be attached to touchscreen 104 using an adhesive, as for example a fugitive adhesive that enables a temporary bond to be formed between button attachment structures 112a, 112b and touchscreen 104.

Figure 2A:
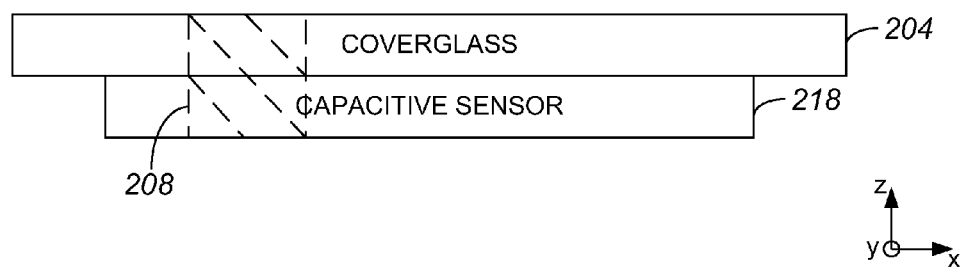
FIG. 2A is a diagrammatic representation of an assembly which includes a capacitive sensor and an overlying coverglass in accordance with an embodiment of the present invention.

With reference to FIG. 2A, one suitable touchscreen assembly on which a button attachment structure may be attached will be described in accordance with an embodiment of the present invention. A touchscreen assembly 216 includes a capacitive sensor 218 over which a coverglass 204 is positioned. Coverglass 204, which may be an insulating glass layer or a plastic layer, effectively protects capacitive sensor 218. When a top surface of coverglass 204 is touched over a touch area 208, capacitive sensor 204 may sense the touch.

Figure 2B:
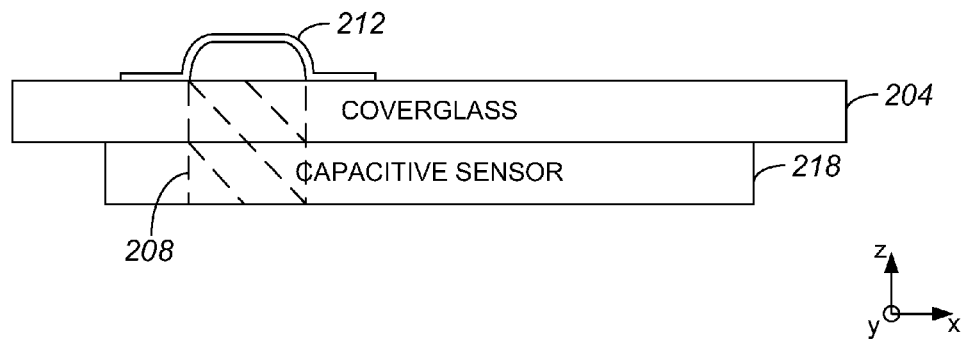
FIG. 2B is a diagrammatic representation of an assembly, e.g., assembly 216 of FIG. 2A, on which a button attachment structure has been positioned in accordance with an embodiment of the present invention.

FIG. 2B is a diagrammatic cross-sectional side-view representation of touchscreen assembly 216' after a button attachment structure has been positioned to at least partially overlie touch area 208 in accordance with an embodiment of the present invention. A button attachment structure 212, which has an approximately dome-like shape, is attached to a top surface of coverglass 204 to at least partially overlie touch area 208. When button attachment structure 212 overlies touch area 208, at least one surface of button attachment structure 212 is at a distance from a top surface of touch area 208. In the described embodiment, button attachment structure 212 may be similar to a suction cup, i.e., button attachment structure 212 may be substantially attached to coverglass 204 using suction forces.

Figure 2C:
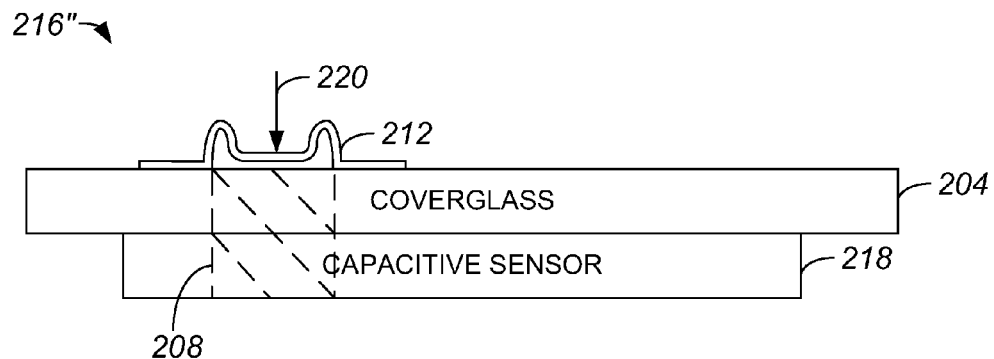
FIG. 2C is a diagrammatic representation of an assembly, e.g., assembly 216' of FIG. 2A, after a force has been applied to cause a portion of the button attachment structure to buckle in accordance with an embodiment of the present invention.

Button attachment structure 212 is arranged to provide click-like tactile feedback to a user when button attachment structure 212 buckles with the application of force and "unbuckles" or returns to a rest state when the force is removed. Specifically, when a user clicks on or presses on button attachment structure 212, button attachment structure 212 buckles and provides tactile feedback to the user. FIG. 2C is a diagrammatic representation of touchscreen assembly 216' after a force has been applied to cause a portion of button attachment structure 212 to buckle in accordance with an embodiment of the present invention. A force 220, which may be provided by the finger of a user, is applied to button attachment structure 212. As shown, force 220 is sufficient to cause button attachment structure 212 to buckle or, more generally, to deform when button attachment structure 212 is clicked or pressed. When button attachment structure 220 deforms, touch area 208 is engaged or activated. In addition, click-like tactile feedback is effectively provided by button attachment structure 212 to a user, e.g., through the finger of a user, to indicate that touch area 208 has been activated.

Figure 3:
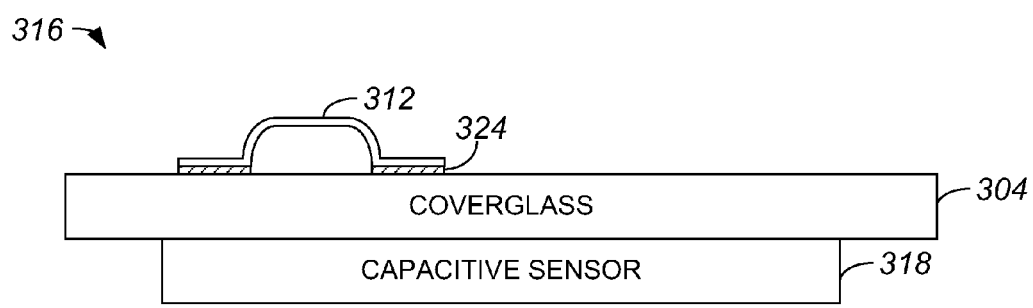
FIG. 3 is a diagrammatic representation of an assembly that includes a button attachment structure coupled to a coverglass by an adhesive material in accordance with an embodiment of the present invention.

Button attachment structure 212 may be in substantially direct contact with coverglass 204 when button attachment structure 212 is mounted on or otherwise held against coverglass 204 by suction or static forces. In general, a button attachment structure may also effectively be held in contact with a coverglass using an adhesive material such as a fugitive adhesive. FIG. 3 is a diagrammatic representation of a touchscreen assembly that includes a button attachment structure coupled to a coverglass by an adhesive material in accordance with an embodiment of the present invention. A touchscreen assembly 316 includes a capacitive sensor 318, a coverglass 304, and a button attachment structure 312. Button attachment structure 312 is mounted to a top surface of coverglass 304 using an adhesive material 324.

Figure 4A:
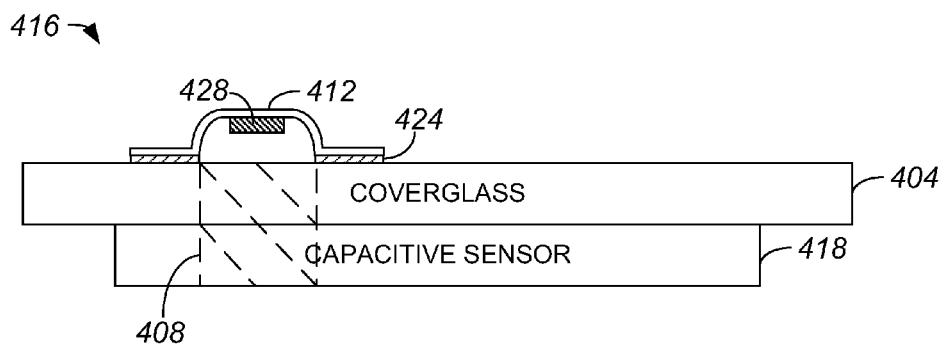
FIG. 4A is a diagrammatic representation of an assembly which includes a button attachment structure that includes a first relatively high-dielectric puck in accordance with an embodiment of the present invention.

In one embodiment, to improve the performance of a device with a touchscreen with which a button attachment structure is used, a relatively high dielectric component may be associated with the button attachment structure. Such a high dielectric component may be coupled to an internal surface of a button attachment structure. FIG. 4A is a diagrammatic representation of an assembly which includes a button attachment structure that includes a relatively high-dielectric component, e.g., puck, in accordance with an embodiment of the present invention. A button attachment structure 412 associated with a touchscreen assembly 416 is mounted to a coverglass 404 which overlies a capacitive sensor 418. Although an adhesive material 424 is shown as being used to couple button attachment structure 412 to coverglass 404, it should be appreciated that the use of adhesive material 424 is substantially optional.

A relatively high dielectric puck 428 is coupled to an internal surface of button attachment structure 412 such that puck 428 moves with button attachment structure 412 when button attachment structure 412 buckles. Puck 428 may be formed from a material such as metal (e.g., copper, titanium dioxide, etc.) or conductive rubber (e.g., silver-doped or graphite-doped silicone), as a few examples. It should be appreciated that the shape and size of puck 428 may vary depending upon factors which may include, but are not limited to including, the size of a touch area 408, the size of button attachment structure 412, and/or the type of material from which puck 428 is formed.

Figure 4B:
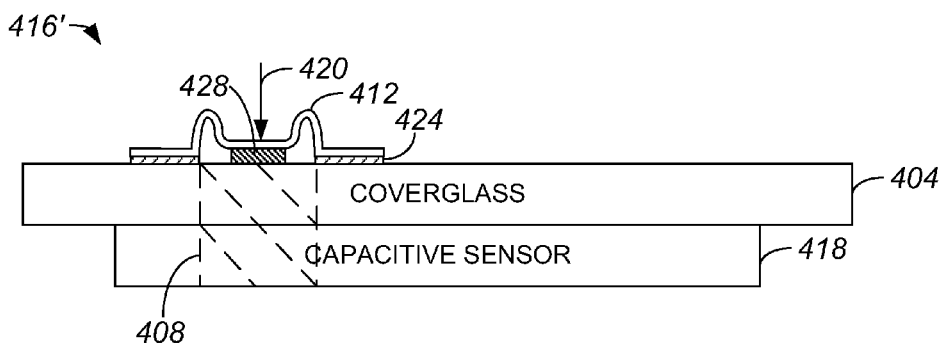
FIG. 4B is a diagrammatic representation of an assembly, e.g., assembly 416 of FIG. 4A, after a force has been applied to cause a first relatively high-dielectric puck to contact a coverglass in accordance with an embodiment of the present invention.

When a force 420 is applied to button attachment structure 412, as shown in FIG. 4B, button attachment structure 412 buckles. When button attachment structure 412 buckles, puck 428 may contact a top surface over coverglass 404 or, more specifically, touch area 408. Hence, touch area 408 is engaged or activated by puck 428.

As previously mentioned, the size and shape of a relatively high dielectric structure which may be used with a button attachment structure may vary. In addition, the touch sensing capabilities of a touchscreen assembly may be provided by sensing devices other than a capacitive sensor.

Figure 5A:
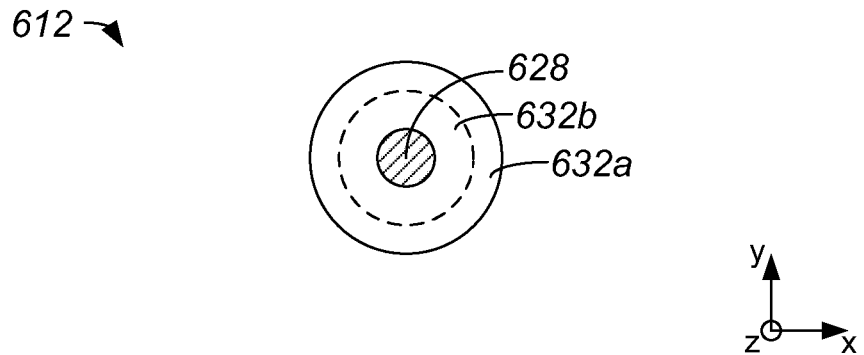
FIG. 5A is a diagrammatic top-view representation of a circularly-shaped button attachment structure in accordance with an embodiment of the present invention.
Figure 5B:
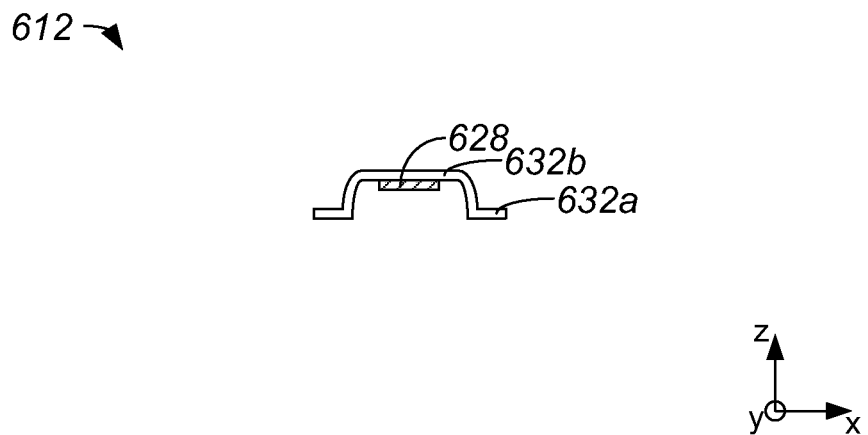
FIG. 5B is a diagrammatic cross-sectional side-view representation of a circularly-shaped button attachment structure, e.g., button structure 612 of FIG. 5A, in accordance with an embodiment of the present invention.

A button attachment structure may generally be of any suitable size and shape. By way of example, a button attachment structure may have a round, approximately circular shape. With reference to FIGS. 5A and 5B, a circularly-shaped button attachment structure will be described in accordance with an embodiment of the present invention. A button attachment structure 612 includes an attachment area 632a and a button actuation area 632b. Attachment area 632a is arranged to be mounted on a touch screen (not shown) either directly or indirectly, e.g., through use of an adhesive material. Button actuation area 632b, which may be a dome-shaped area, is arranged to be aligned at least partially over a touch sensitive area (not shown). Button actuation area 632b is also arranged to substantially buckle when a force is applied.

In the described embodiment, a relatively high dielectric structure 628 is coupled to an internal surface of button actuation area 632b. Structure 628 may be coupled to button actuation area 632b using an adhesive or the like. While structure 628 is shown as being of an approximately cylindrical shape, it should be appreciated that structure 628 may be of any suitable shape. Examples of other suitable shapes will be described below with respect to FIGS. 10A-C.

Figure 6:
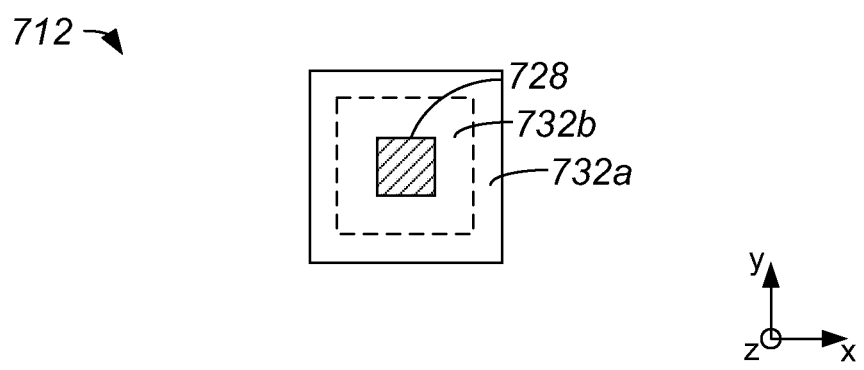
FIG. 6 is a diagrammatic top-view representation of a rectangularly-shaped button attachment structure in accordance with an embodiment of the present invention.

Rather than being of an approximately circular shape, a button attachment structure may be of an approximately polygonal, e.g., rectangular, shape. FIG. 6 is a diagrammatic top-view representation of a rectangularly-shaped button attachment structure in accordance with an embodiment of the present invention. A button attachment structure 712 that is substantially rectangularly shaped includes an attachment area 732a and a button actuation area 732b. A relatively high dielectric structure 728 is coupled to an internal surface of button actuation area 732b, as shown. It should be appreciated that structure 728 is optional, i.e., that button attachment structure 712 may be arranged to be used without structure 728.

Figure 7:
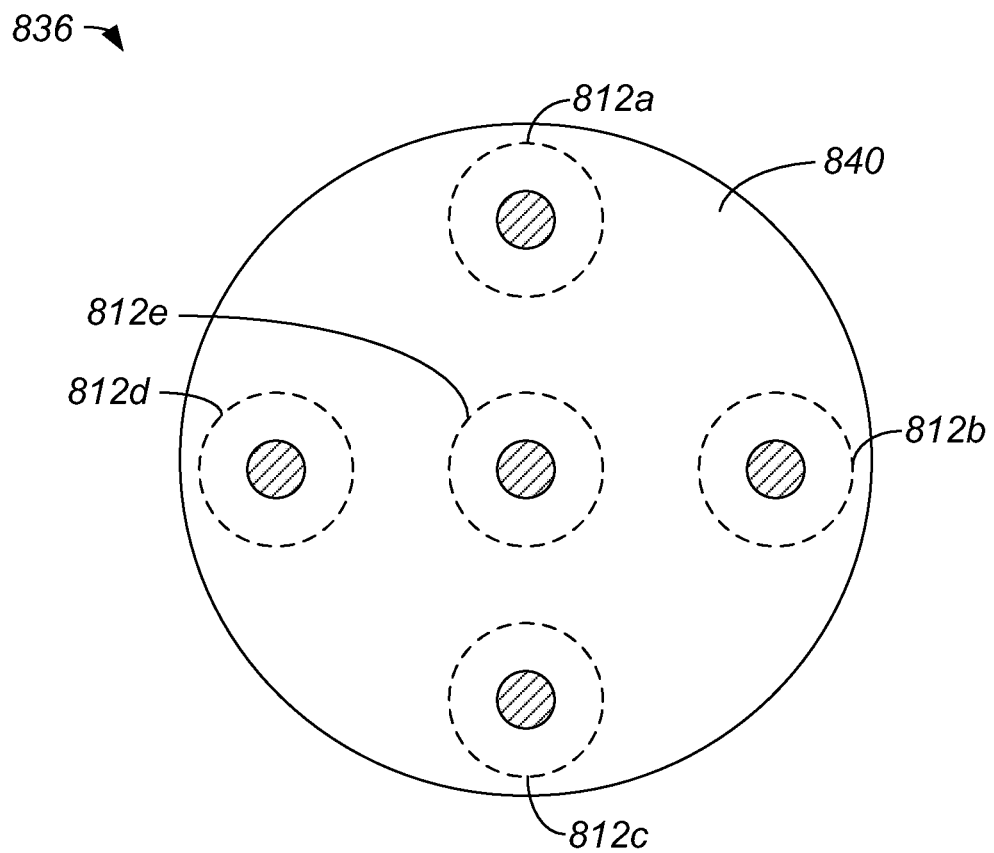
FIG. 7 is a diagrammatic representation of a button attachment structure that includes multiple buttons in accordance with an embodiment of the present invention.

More than one button attachment structure may be positioned on a surface of a touchscreen. While a separate button attachment structure may be used for each touch area of a touch screen, a single button attachment structure which includes multiple button actuator areas may instead be positioned on the surface of a touchscreen to accommodate multiple touch areas. FIG. 7 is a diagrammatic representation of a button attachment structure that includes multiple buttons, or multiple button actuation areas, in accordance with an embodiment of the present invention. A button attachment structure 836 includes an attachment portion 840 which is configured to be attached to a surface of a touchscreen (not shown). Attachment portion 840 is effectively coupled to multiple button actuation areas 812a-e. Button actuation areas 812a-e are arranged to substantially overlie touch areas associated with a touchscreen (not shown) when attachment portion 840 is attached to the touchscreen. In one embodiment, button actuation areas 812a-e have substantially dome-like shapes.

Figure 8:
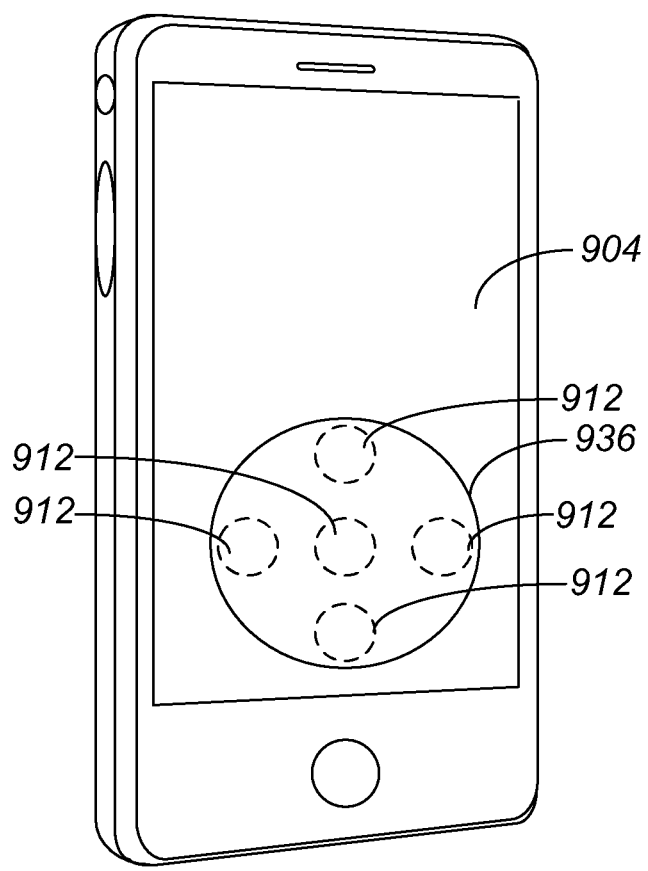
FIG. 8 is a diagrammatic representation of a portable electronic device with a touchscreen on which a button attachment structure that includes multiple buttons is attached in accordance with an embodiment of the present invention.

FIG. 8 is a diagrammatic representation of a portable electronic device with a touchscreen on which a button attachment structure that includes multiple buttons is attached in accordance with an embodiment of the present invention. A portable electronic device 900 includes a touchscreen 904 on which a button attachment structure 936 may be positioned. Button attachment structure 936 is typically positioned on touchscreen 904 such that at least one of buttons 912 overlies a touch area (not shown) of touchscreen 904. Hence, when a button 912 is pressed such that a touch area (not shown) underlying that button 912 is effectively contacted, the touch area is engaged.

Figure 9:
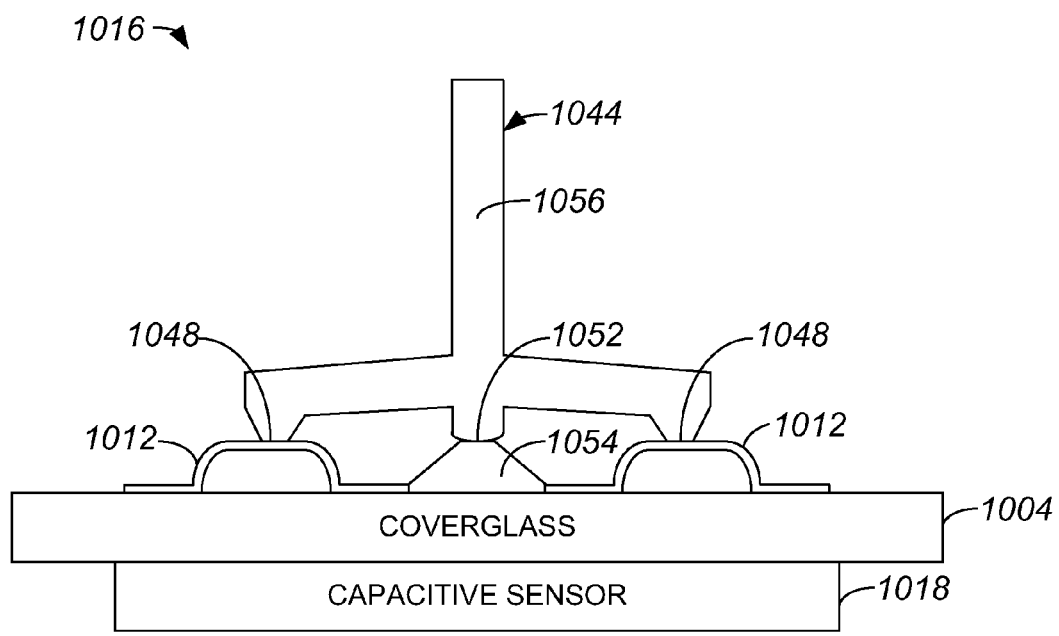
FIG. 9 is a diagrammatic representation of an assembly which includes a plurality of button attachment structures and a joystick arrangement in accordance with an embodiment of the present invention.

Multiple button attachment structures, or a single button attachment structure which includes more than one button actuation area, may be used with a joystick arrangement to provide input to a portable electronic device. FIG. 9 is a diagrammatic representation of an assembly which includes a plurality of button attachment structures and a joystick arrangement in accordance with an embodiment of the present invention. An assembly 1016 includes a capacitive sensor 1018 over which a coverglass is positioned. A plurality of button attachment structures 1012 are coupled to a top surface of coverglass 1004. A joystick actuator 1044, which may be formed from a material such as rubber or plastic, includes a shaft portion 1056 and contact points 1048. Contact points 1048 are arranged to contact button attachment structures 1012 such that contact points 1048 may cause portions of button attachment structures 1012 to buckle and, hence, activate touch areas (not shown) which underlie button attachment structures 1012.

Joystick actuator 1044 also includes a pivot point 1052 and an attachment portion 1054. Attachment portion 1054 is arranged to effectively secure joystick actuator 1044 to a top surface of coverglass 1004 such that when shaft portion 1056 pivots with respect to pivot point 1052, e.g., to apply a force on at least one button attachment structure 1012 through at least one contact point 1048, joystick actuator 1044 remains secured against coverglass 1004.

Figure 10A:
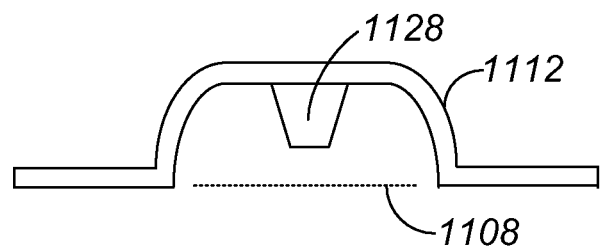
FIG. 10A is a diagrammatic cross-sectional side-view representation of a complaint or deformable relatively high dielectric structure when a relatively low force is applied in accordance with an embodiment of the present invention.

As discussed above, a relatively high dielectric structure which may be used with a button attachment structure may be of any suitable size or shape. In one embodiment, a relatively high dielectric structure may be formed from a compliant material that effectively molds itself depending upon the amount of force applied to the button attachment structure. Exemplary materials for the relatively high dielectric structures can, for example, include titanium dioxide, silver or graphite doped silicone, etc. That is, a relatively high dielectric structure may be used to provide force sensitivity through having a substantially variable contact area. The size of the area of a relatively high dielectric structure that substantially contacts a touch area of a touchscreen may vary with the amount of force applied to the structure. FIG. 10A is a diagrammatic cross-sectional side-view representation of a complaint or deformable relatively high dielectric structure when a relatively low force is applied in accordance with an embodiment of the present invention. A deformable dielectric structure 1128 is coupled to a surface of a button attachment structure 1112. As shown, when a relatively low amount of force is applied to button attachment structure 1112, e.g., when structure 1128 does not contact a surface 1108 of a touchscreen, structure 1128 is in a substantially default or rest state.

Figure 10B:
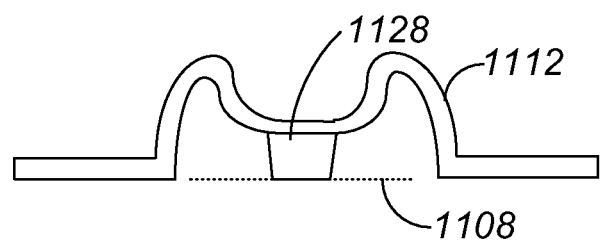
FIG. 10B is a diagrammatic cross-sectional side-view representation of a deformable relatively high dielectric structure, e.g., deformable relatively high dielectric structure 1128 of FIG. 10A, when a medium force is applied in accordance with an embodiment of the present invention.

FIG. 10B is a diagrammatic cross-sectional side-view representation structure 1128 when a medium amount of force is applied in accordance with an embodiment of the present invention. When a medium amount of force is applied to button attachment structure 1112 such that button attachment structure 1112 buckles and structure 1128 is effectively forced against surface 1108, structure 1128 may deform such that an area of structure 1128 that contacts surface 1108 is larger than it was when a relatively low amount of force was applied to button attachment structure 1112.

Figure 10C:
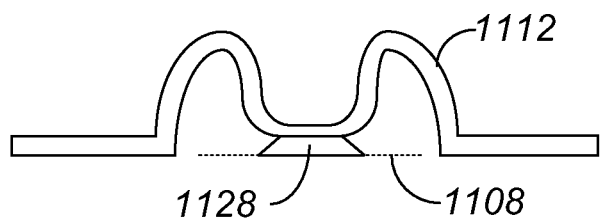
FIG. 10C is a diagrammatic cross-sectional side-view representation of a deformable relatively high dielectric structure, e.g., deformable relatively high dielectric structure 1128 of FIG. 10A, that is suitable for use when a relatively high force is applied in accordance with an embodiment of the present invention.

Once a surface of structure 1128 contacts surface 1108, as the amount of force applied to button attachment structure 1112 increases, the area of structure 1128 which contacts surface 1108 also increases. As shown in FIG. 10C, when a relatively high amount of force is applied to button attachment structure 1112, structure 1128 deforms such that a larger area of surface 1108 is touched by structure 1128 than was the case when a medium amount of force was applied.

Although only a few embodiments of the present invention have been described, it should be understood that the present invention may be embodied in many other specific forms without departing from the spirit or the scope of the present invention. By way of example, while the use of button attachment structures has been described as being suitable for use on touchscreens associated with portable electronic devices, button attachment structures are not limited to being used on touchscreens associated with portable electronic devices. In general, button attachment structures may be used with any suitable display screen. Suitable display screens include, but are not limited to including, display screens associated with computing devices, terminals, automated teller machines (ATMs), point-of-sale payment devices, and the like.

When a touchscreen is capacitive, engaging or activating a touch area of the touchscreen may occur substantially without actual physical contact being made with the touch area. A capacitive touchscreen may sense when an object, e.g., a finger or a surface of a button attachment structure, is in relatively close proximity to the touch area. When the object is sensed, the touch area may be engaged or activated.

While a plurality of button attachment structures has been described as being used with a joystick actuator, a single button attachment structure that includes a plurality of button actuation areas may instead be used with a joystick actuator. Further, the number of button attachment structures and the number of button actuation areas associated with a button attachment structure may vary widely.

The size and the shape of button attachment structures may vary widely. A button attachment structure may be sized and shaped to accommodate the particular application for which the button attachment structure is to be used.

While a button attachment structure has generally been described as being removably attached to a display screen, it should be appreciated that a button attachment structure may instead be substantially irremovably attached to a display screen. That is, a button attachment structure may be attached to a display screen such that it is effectively permanently attached to the display screen or attached to the display screen such that the removal of the button attachment structure essentially renders the button attachment structure unusable.

A touchscreen may include a coverglass and a capacitive sensor, as previously described. A touchscreen may also include a resistive touch sensor. In lieu of a capacitive sensor or a resistive touch sensor, however, a touchscreen may include other types of sensors or use other types of technologies to effectively sense touch. For instance, a touchscreen may include infrared sensors, piezoelectric sensors, or strain gauge sensors. A touchscreen may also utilize dispersive signal technologies and surface acoustic wave technologies. In general, button attachment structures may be used with a variety of different touchscreens, and are not limited to being used with touchscreens which utilize capacitive sensing technologies.

Button attachment structures may be formed using substantially any suitable methods or processes. For example, button attachment structures may be formed using a compression molding process.

The operations associated with the various methods of the present invention may vary widely. By way of example, steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An apparatus comprising:
a display arrangement including a touch sensor and a coverglass, the coverglass being arranged to overlie the touch sensor, the coverglass including a first surface, the first surface being an exposed outer surface of the apparatus and including a first touch-sensitive area, the first touch-sensitive area being arranged to sense touch;
a first button attachment structure, the first button attachment structure including a first attachment area and a first button actuation area, the first attachment area being mounted on the first surface, the first button actuation area being aligned at least partially over the first touch-sensitive area; and
a compliant dielectric structure coupled to a surface of the first button actuation area, wherein:
a first area of the dielectric structure engages the first touch sensitive area in response to a first amount of force applied to the first button actuation area;
a second area of the dielectric structure engages the first touch sensitive area in response to a second amount of force applied to the first button actuation area;
the first touch sensitive area is arranged to activate a function associated with the apparatus when engaged by the dielectric structure; and
the first button actuation area is arranged to deform when a force is applied to the first button actuation area.

2. The apparatus of claim 1 wherein the first button attachment structure is mounted on the display arrangement using a suction force.

3. The apparatus of claim 1 wherein the first button attachment structure is mounted on the display arrangement using a static force.

4. The apparatus of claim 1 wherein the first button attachment structure is mounted on the display arrangement using an adhesive material.

5. The apparatus of claim 1 wherein the first button attachment structure is formed from a material selected from the group including a silicone rubber and a flexible plastic.

6. The apparatus of claim 1 wherein the first surface further includes a second touch-sensitive area and the first button attachment structure further includes a second button actuation area, the second button actuation area being aligned at least partially over the second touch-sensitive area.

7. The apparatus of claim 1 wherein the display arrangement is a touchscreen arrangement.

8. The apparatus of claim 7 wherein the touchscreen arrangement being configured to visually present touch area locations.

9. The apparatus of claim 7 wherein the touchscreen arrangement includes a resistive touch sensor.

10. The apparatus of claim 1 wherein the first button actuation area is arranged to engage the first touch-sensitive area by directly contacting the first touch-sensitive area.

11. The apparatus of claim 1 wherein the apparatus is one selected from the group including a cellular telephone, a media player, a computing device, a game player, and a personal digital assistant.

12. The apparatus of claim 1 wherein the first attachment structure has an approximately dome-like shape.

13. A portable electronic device comprising: a touch sensor; a touchscreen being arranged to overlie the touch sensor, the touchscreen including an exposed outer surface of the portable electronic device the touchscreen having a first touch-sensitive area, wherein the first touch-sensitive area is arranged to detect a presence of a touch, wherein the first touch-sensitive area is non-tactile; and a tactile structure having an outer surface and an inner surface, the tactile structure being mounted on the touchscreen such that the tactile structure at least partially overlies the first touch-sensitive area, wherein the tactile structure is configured to provide a physical interface that is arranged to engage the first touch-sensitive area; and a dielectric structure formed from a compliant material coupled to the inner surface of the tactile structure; wherein the tactile structure and dielectric structure are arranged to move between a first position and a second position, the tactile structure and dielectric structure arranged to deform to the second position when a force is applied to the tactile structure, wherein a first area of the dielectric structure engages the first touch-sensitive area in response to a first amount of force applied to a first portion of the outer surface of the tactile structure and a second area of the dielectric structure engages the first touch-sensitive area in response to a second amount of force applied to the first portion of the outer surface of the tactile structure, and wherein subsequent to the applied force, the tactile structure and dielectric structure return to the first position when the applied force is removed.

14. The portable electronic device of claim 13 wherein the tactile structure includes a dome area, the dome area being arranged to overlie the first touch-sensitive area.

15. The portable electronic device of claim 14 wherein the dome area is arranged to buckle when a force is applied to the dome area, and wherein the dome area engages the first touch-sensitive area when the force is applied to the dome area.

16. The portable electronic device of claim 14 wherein the dielectric structure being mounted to a surface of the dome area.

17. The portable electronic device of claim 16 wherein the dome area is arranged to buckle when a force is applied to the dome area, and wherein the dielectric structure engages the first touch-sensitive area when the force is applied to the dome area.

18. The portable electronic device of claim 13 wherein the tactile structure is mounted on the touchscreen using a suction force.

19. The portable electronic device of claim 13 wherein the tactile structure is mounted on the touchscreen using a static force.

20. The portable electronic device of claim 13 wherein the tactile structure is mounted on the touchscreen using an adhesive material.

21. The portable electronic device of claim 13 wherein the tactile structure is formed from one selected from the group including silicone rubber and flexible plastic.

* * * * *